(12) United States Patent
Cusin et al.

(10) Patent No.: US 12,124,223 B2
(45) Date of Patent: Oct. 22, 2024

(54) METHOD OF FABRICATING A TIMEPIECE COMPONENT AND COMPONENT OBTAINED FROM THIS METHOD

(71) Applicant: Nivarox-FAR S.A., Le Locle (CH)

(72) Inventors: Pierre Cusin, Villars-Burquin (CH); Alex Gandelhman, Colombier (CH); Michel Musy, Orpund (CH); Clare Golfier, La Neuveville (CH)

(73) Assignee: NIVAROX-FAR S.A., Le Locle (CH)

( * ) Notice: Subject to any disclaimer, the term of this patent is extended or adjusted under 35 U.S.C. 154(b) by 162 days.

(21) Appl. No.: 17/121,095

(22) Filed: Dec. 14, 2020

(65) Prior Publication Data

US 2021/0191338 A1 Jun. 24, 2021

(30) Foreign Application Priority Data

Dec. 18, 2019 (EP) ..................................... 19217376

(51) Int. Cl.
| | |
|---|---|
| *C25D 1/00* | (2006.01) |
| *B29C 59/02* | (2006.01) |
| *G03F 7/20* | (2006.01) |
| *G04D 3/00* | (2006.01) |

(52) U.S. Cl.
CPC ............ *G04D 3/0069* (2013.01); *B29C 59/02* (2013.01); *C25D 1/00* (2013.01); *G03F 7/20* (2013.01)

(58) Field of Classification Search
None
See application file for complete search history.

(56) References Cited

U.S. PATENT DOCUMENTS

| | | | | |
|---|---|---|---|---|
| 3,853,714 | A * | 12/1974 | Shimada | C25D 1/02 205/273 |
| 6,027,630 | A * | 2/2000 | Cohen | C25D 17/06 205/135 |
| 2002/0045028 | A1* | 4/2002 | Teshima | G02B 3/0031 428/161 |
| 2006/0127690 | A1* | 6/2006 | Ueda | C23F 1/02 428/596 |
| 2011/0146070 | A1* | 6/2011 | Fiaccabrino | G03F 7/0035 29/846 |
| 2011/0233063 | A1* | 9/2011 | Seki | C25D 1/00 205/70 |

(Continued)

FOREIGN PATENT DOCUMENTS

| | | |
|---|---|---|
| CN | 102124409 A | 7/2011 |
| CN | 102712110 A | 10/2012 |
| CN | 102746033 A | 10/2012 |

(Continued)

OTHER PUBLICATIONS

English translation DE 10143126. (Year: 2007).*

(Continued)

*Primary Examiner* — Stefanie S Wittenberg
(74) *Attorney, Agent, or Firm* — Sughrue Mion, PLLC

(57) ABSTRACT

A method for fabricating a metallic timepiece component, wherein the method includes the steps of forming, via a UV-LIGA type process combined with hot stamping, a multi-level photosensitive resin mould and electroplating a layer of at least one metal from at least two conductive layers to form a block that substantially reaches the upper surface of the photosensitive resin.

17 Claims, 1 Drawing Sheet

(56) References Cited

U.S. PATENT DOCUMENTS

2019/0032233 A1* 1/2019 Wang .................. G03F 7/38

FOREIGN PATENT DOCUMENTS

| | | | |
|---|---|---|---|
| CN | 112987491 A | | 6/2021 |
| CN | 112987492 A | | 6/2021 |
| JP | 2006-161138 A | | 6/2006 |
| JP | 2006-299371 A | | 11/2006 |
| JP | 2016-176090 A | | 10/2016 |
| KR | 10-2011-0042121 A | | 4/2011 |
| WO | 2010/020515 A1 | | 2/2010 |
| WO | 2013/182615 A1 | | 12/2013 |

OTHER PUBLICATIONS

Xiaolei Chen et al., "The Fabrication and Application of a PDMS Micro Through-Holes Mask in Electrochemical Micromanufacturing", Advances in Mechanical Engineering, vol. 2014, Article ID 943092, pp. 1-7 ( 7 pages total).
Communication dated Jul. 1, 2021, from the intellectual Property of India in application No. 202044054213.
Walter Bacher, et al., "The LIGA Technique and Its Potential for Microsystems—A Survey", IEEE Transactions on Industrial Electronics, Oct. 1995, pp. 431-441, vol. 42, No. 5.
European Search Report for EP 19 21 7376 dated Jun. 19, 2020.
Translation of the Office Action issued Oct. 6, 2021 in Taiwanese Application No. 109143033.
Office Action issued Oct. 6, 2021 in Taiwanese Application No. 109143033.

* cited by examiner

METHOD OF FABRICATING A TIMEPIECE COMPONENT AND COMPONENT OBTAINED FROM THIS METHOD

CROSS REFERENCE TO RELATED APPLICATIONS

This application is claiming priority based on European Patent Application No. 19217376.3 filed on Dec. 18, 2019, the disclosure of which is incorporated herein in its entirety by reference.

FIELD OF THE INVENTION

The present invention concerns a method for fabricating a complex multi-level metallic structure by means of LIGA technology. The invention also concerns a metallic structure of this type, particularly timepiece components, obtained from this method.

BACKGROUND OF THE INVENTION

Methods that correspond to the above definition are already known. In particular, the article by A. B. Frazier et al. entitled "Metallic Microstructures Fabricated Using Photosensitive Polyimide Electroplating Molds", Journal of Microelectromechanical systems (Vol. 2 N deg. 2 June 1993) describes a method of fabricating multi-level metallic structures by electroplating in polyimide moulds made by photolithography of photosensitive resin layers. This method includes the following steps:
  creating a sacrificial metallic layer and an adhesion layer for a subsequent electroplating step;
  spreading a layer of photosensitive polyimide,
  irradiating the polyimide layer with UV radiation through a mask corresponding to the contour of one level of the structure to be formed,
  developing the polyimide layer by dissolving the non-irradiated parts so as to obtain a polyimide mould,
  filling the mould with nickel to the top thereof by electroplating and obtaining a substantially flat upper surface,
  depositing a thin layer of chromium over the entire upper surface by vacuum vaporization,
  depositing a new layer of photosensitive resin on the chromium layer,
  irradiating the resin layer through a new mask corresponding to the contour of the next level of the structure to be obtained,
  developing the polyimide layer so as to obtain a new mould,
  filling the new mould with nickel to the top thereof by galvanic growth,
  separating the multi-level structure and the polyimide mould from the sacrificial layer and from the substrate,
  separating the multi-level structure from the polyimide mould.

It will be clear that the method that has just been described can, in principle, be iteratively implemented to obtain metallic structures having more than two levels.

Patent No. WO 2010/020515A1, discloses the fabrication of a part with several levels by producing a complete photoresist mould corresponding to the final part to be obtained prior to the step of electroplating the metal of the part in the mould. Only multi-level parts wherein projections of the levels are contained within each other can be made by this method.

There is also known from Patent No. EP2405301A, a photoresist mould comprising at least two levels, the levels formed in the substrate comprising only smooth vertical sidewalls.

These methods only allow the fabrication of parts whose basic geometries are cylindrical, and do not allow the fabrication of parts having complex geometries such as bevels or chamfers.

SUMMARY OF THE INVENTION

It is an object of the present invention to overcome the aforementioned drawbacks in addition to others by providing a method allowing the fabrication of multi-level metallic timepiece components, by combining a hot stamping step with LIGA technology, wherein a conductive layer is associated with a resin layer for each level to allow reliable electroplating in the case of multi-level components.

It is also an object of the present invention to allow the fabrication of timepiece parts having complex geometries that are not usually feasible using LIGA technology.

To this end, the invention concerns a method for fabricating a timepiece component comprising the following steps:
  a) providing the substrate, depositing thereon a first electrically conductive layer and applying a first layer of photosensitive resin;
  b) hot stamping the first resin layer using a stamp, pressing the stamp down to the substrate to shape said resin layer and define a first layer of the timepiece component;
  c) irradiating the first shaped resin layer through a mask defining a first level of the component and dissolving the non-irradiated areas of the photosensitive resin layer to reveal the first electrically conductive layer in places;
  e) applying a second layer of photosensitive resin covering the structure resulting from step c), then irradiating the second resin layer through a mask defining a second level of the component and dissolving the non-irradiated areas of the second photosensitive resin layer to form a mould comprising a first and a second level;
  f) depositing by electroforming a metallic layer in the mould from the first conductive layer to form the component, the layer substantially reaching the upper surface of the second photosensitive resin layer;
  g) successively removing the substrate, the first conductive layer and the resin to release the component.

This method thus allows the fabrication of multi-level parts.

According to other advantageous variants of the invention:
  step b) is carried out under vacuum.
  during step b), the first resin layer is heated to between 70° C. and 150° C.,
  the stamp has a relief print, at least one part of the print being arranged to be pressed directly against the surface of the substrate in step b);
  said stamp print defines said at least a first level of the component;
  the method includes an optional step d), after step c), which consists in locally depositing a second electrically conductive layer on the irradiated areas of the first resin layer;
  the second electrically conductive layer is deposited through a stencil mask;

the second electrically conductive layer is applied in a general deposition over all the exposed surfaces (sidewalls included) and is then completely removed, except from the upper surface of the first resin layer, where it has been protected by means of a resist deposited by a transfer press step;

the second electrically conductive layer is deposited by printing a conductive resin or ink;

said first layer and said second electrically conductive layer are of the Au, Ti, Pt, Ag, Cr or Pd type or a stack of at least two of these materials;

the substrate is made of silicon;

the first conductive layer has a thickness comprised between 50 nm and 500 nm;

the second conductive layer has a thickness comprised between 50 nm and 500 nm.

Finally, the invention relates to a timepiece component obtained from a method according to the invention, such as a pallet fork or an escape wheel, for example.

It is clear that the method of the invention is of particularly advantageous application for the fabrication of components for timepieces.

BRIEF DESCRIPTION OF THE DRAWINGS

Other features and advantages of the present invention will appear more clearly from the following detailed description of an example embodiment of a method according to the invention, this example being given purely by way of non-limiting illustration in conjunction with the annexed drawing, in which.

DETAILED DESCRIPTION OF A PREFERRED EMBODIMENT

Figure 1:
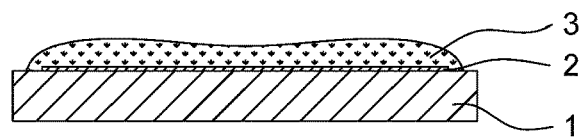
FIGS. 1 to 8 illustrate the method steps of one embodiment of the invention for producing a timepiece component.

The substrate 1 used in step a) of the method according to the invention is, for example, formed by a silicon substrate. In first step a) of the method, there is deposited, for example, by physical vapour deposition (PVD), a first conductive layer 2, i.e. a layer capable of starting a galvanic metal deposition. Typically, first conductive layer 2 is of the Au, Ti, Pt, Ag, Cr or Pd type (FIG. 1), or a stack of at least two of these materials, and has a thickness comprised between 50 nm and 500 nm. For example, first conductive layer 2 can be formed of a sublayer of chromium or of titanium covered with a layer of gold or copper.

The photosensitive resin 3 used in this method is preferably an octo-functional epoxy-based negative resin such as SU-8 resin devised to polymerize under the action of UV radiation.

According to a particular embodiment of the invention, the resin takes the form of a dry film, the resin is then applied by lamination to substrate 1.

Alternatively, the photosensitive resin could be a positive photoresist which is devised to break down under the action of UV radiation. It will be understood that the present invention is not limited to a few particular types of photosensitive resin. Those skilled in the art will know how to choose a photosensitive resin suitable for their needs from among all the known resins that are suited to UV photolithography.

The first resin layer 3 is deposited on substrate 1 by any suitable means, by centrifugal coating, with a spin coater, or by spraying to the desired thickness. Typically, the thickness of the resin is comprised between 10 μm and 1000 μm, and preferably between 30 μm and 300 μm. Depending on the desired thickness and the deposition technique used, resin 3 will be deposited in one or more steps.

First resin layer 3 is then heated typically to between 90 and 120° for a duration that depends on the thickness deposited, to remove the solvent (pre-bake step). This heating process dries and hardens the resin.

Figure 2:
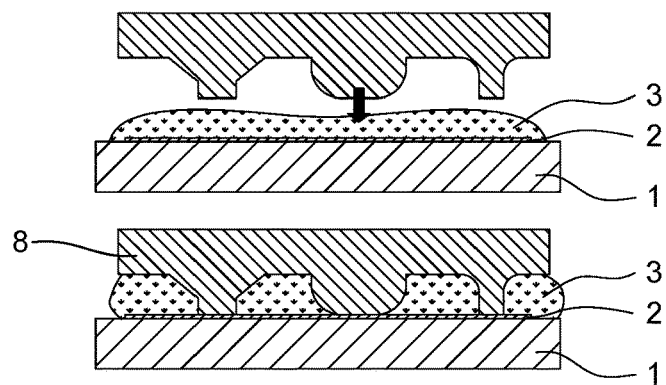

The next step b) illustrated in FIG. 2 consists in hot stamping or imprinting first resin layer 3 to shape it and define a first level of the timepiece component. The resin is first heated to a temperature comprised between 70° C. and 150° C. at which it becomes viscous, to allow it to be shaped by being flattened by means of a stamp 8 pressing thereon. This step can be carried out under vacuum to prevent the formation of air bubbles when resin layer 3 is pressed. According to the invention, stamp 8 is pressed until the resin is completely flattened, down to substrate 1, such that there remains only a residual layer of resin above the conductive layer where the parts of the stamp were pressed against the substrate.

Advantageously, stamp 8 has a relief print, which may have variations in height, thereby defining at least a first level of the component, said at least one first level thus has a complex three-dimensional geometry which is impossible to obtain via a conventional LIGA process.

It is also possible to envisage forming two or more levels by means of the stamp to produce the complete geometry of the component to be obtained.

Figure 3:
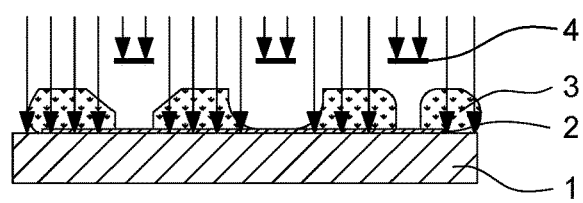

The next step c) illustrated in FIG. 3 consists in irradiating first resin layer 3 by UV radiation through a mask 4 defining the first level of the component to be formed and thus photopolymerized areas 3a and non-photopolymerized areas 3b.

This step ensures that the residual resin film remaining after pressing by the stamp disappears to reveal the conductive layer and allows the resin to be structured as usually carried out in a LIGA process.

A post-bake step of first resin layer 3 may be required to complete the photopolymerization induced by the UV irradiation. This post-bake step is preferably carried out between 90° C. and 95° C. Photopolymerized areas 3a become insensitive to most solvents. However, the non-photopolymerized areas could subsequently be dissolved by a solvent.

Figure 4:
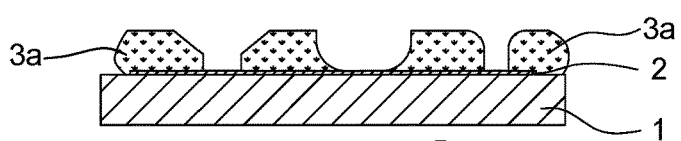

Next, the non-photopolymerized areas 3b of first photosensitive resin layer 3 are dissolved to reveal first conductive layer 2 of substrate 1 in places, as in FIG. 4. This operation is carried out by dissolving non-polymerized areas 3b using a suitable solvent, such as PGMEA (propylene glycol methyl ether acetate). A mould made of photopolymerized photosensitive resin 3a is thus obtained, formed by the combination of a stamping and photolithography operation, defining the first level of the component.

Figure 5:
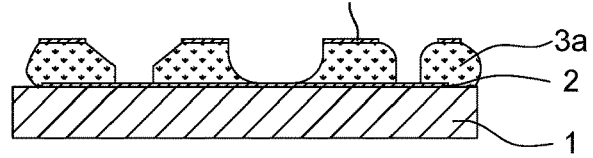

In an optional step d) illustrated in FIG. 5, a second conductive layer 5 is deposited on areas 3a photopolymerized in the preceding step. This second conductive step-layer 5 may have the same characteristics as first conductive layer 2, namely it is of the Au, Ti, Pt, Ag, Cr or Pd type or a stack of at least two of these materials, and has a thickness comprised between 50 nm and 500 nm.

According to a first variant of the invention, a stencil mask, which is positioned by optical alignment, is used. This equipment makes it possible to ensure good alignment of the mask with the geometry of photopolymerized areas 3a on the substrate and thus to ensure deposition only on the upper surface of photopolymerized areas 3a, avoiding deposition on the sidewalls of photopolymerized resin 3a as the mask is held as close as possible to substrate 1.

According to a second variant of the invention, the second electrically conductive layer is applied in a general deposition over all the exposed surfaces (sidewalls included) and then entirely removed except from the upper surface of the first resin layer, where it was protected by means of a resist deposited by a transfer press step.

Those skilled in the art could also consider the implementation of 3D printing to deposit second conductive layer 5.

Such solutions make it possible to obtain a selective and more precise deposition of second electrically conductive layer 5, and thus without any deposition on the sidewalls of photopolymerized resin 3a.

Figure 6:
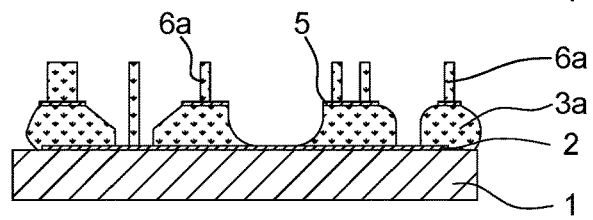

The next step e) illustrated in FIG. 6 consists in depositing a second photosensitive resin layer 6 covering the structure resulting from the preceding step. The same resin is used in this step, and the thickness is greater than that deposited in step a). Generally speaking, the thickness varies as a function of the geometry of the component that it is desired to obtain.

The next step consists in irradiating second resin layer 6 through a mask 4" defining a second level of the component and dissolving non-irradiated areas 6b of second photosensitive resin layer 6. At the end of this step (FIG. 6), there is obtained a mould comprising a first and a second level, revealing, in places, first electrically conductive layer 2 and second electrically conductive layer 5.

Figure 7:
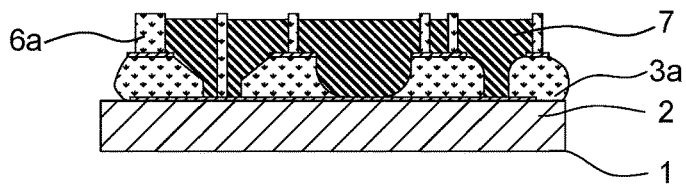
Figure 8:
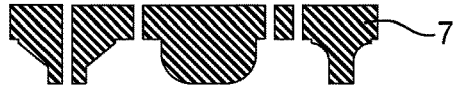

The next step f) illustrated in FIG. 7 consists in depositing in the mould, by electroforming or electroplating, a layer 7 of a metal from first layer 2 and possibly second electrically conductive layer 5 to form a block that preferably reaches a lower height than the height of the mould, which provides better mechanical strength during any subsequent machining. In this context, "metal" naturally includes metal alloys. Typically, the metal will be selected from among the group including nickel, copper, gold or silver, and, as alloys, copper-gold, nickel-cobalt, nickel-iron, nickel-phosphorus or nickel-tungsten. Generally speaking, the multi-layer metallic structure is entirely made of the same alloy or metal. However, it is also possible to change the metal or alloy during the electroplating step in order to obtain a metallic structure comprising at least two layers of different types.

The electroforming conditions, in particular the composition of the baths, system geometry, voltages and current densities, are selected for each metal or alloy to be electrodeposited in accordance with techniques that are well known in the art of electroforming.

Metallic layer 7 can be machined by a mechanical process to obtain a thickness predefined by the thickness of the component to be produced. Depending on the face on which this operation has to be carried out, the finish machining can be carried out whilst on a wafer.

Step g) consists in releasing the component by removing the substrate, the conductive layers or the resin layers, in a succession of wet or dry etch steps, operations which are familiar to those skilled in the art. For example, first conductive layer 2 and substrate 1 are removed by means of a wet etch, which allows the component to be released from substrate 1 without being damaged. In particular, the silicon substrate can be etched with a potassium hydroxide solution (KOH).

At the end of this first sequence, there is obtained a component held in the first and second resin layers, with second conductive layer 5 also still present in places.

A second sequence consists in removing first layer 3 and second layer 6 of resin by means of $O_2$ plasma etches, separated by wet etches of the intermediate metallic layers.

At the end of this step, the components obtained can be cleaned, and possibly reworked on a machine-tool to perform machining operations or for an aesthetic finish. At this stage, the parts can be used immediately or subjected to various decorative and/or functional treatments, typically physical or chemical depositions.

The method of the invention finds particularly advantageous application in the fabrication of components for timepieces, such as springs, pallet forks, wheels, appliques, etc. As a result of this method, it is possible to make components of more diverse shapes and having more complex geometries than those obtained via conventional photolithography operations. Such a method also makes it possible to obtain robust components which have good reliability in terms of geometry.

The invention claimed is:
1. A method for the fabrication of at least one timepiece component comprising the following steps:
   a) providing a substrate (1), depositing thereon a first electrically conductive layer (2) and applying a first photosensitive resin layer (3);
   b) hot stamping the first photosensitive resin layer (3) using a stamp, pressing the stamp (8) down to the substrate, in order to shape the first photosensitive resin layer and define a first level of the timepiece component;
   c) irradiating the first shaped photosensitive resin layer (3) through a mask (4) defining at least a first level of the timepiece component and dissolving the non-irradiated areas (3b) of the photosensitive resin layer (3) to reveal, in places, the first electrically conductive layer (2);
   d) applying a second photosensitive resin layer (6) covering the structure resulting from step c), then irradiating the second photosensitive resin layer (6) through a mask (4") defining a second level of the timepiece component and dissolving the non-irradiated areas (6b) of the second photosensitive resin layer (6) to form a mould comprising a first and a second level;
   e) depositing by electroforming a metallic layer (7) in the mould from the first electrically conductive layer (2) to form the timepiece component, the metallic layer (7) substantially reaching the upper surface of the second photosensitive resin layer (6);
   f) successively removing the substrate, the first electrically conductive layer, the first photosensitive resin layer (3) and the second photosensitive resin layer (6) to release the timepiece component,
   wherein, in step b) a surface of the first photosensitive resin layer (3) is formed as one of beveled and chamfered, and
   in step e) a surface of the timepiece component is formed as the one of beveled and chamfered against the surface of the first photosensitive resin layer (3),
   wherein the method includes a step d'), after step c), which consists in locally depositing a second electrically conductive layer (5) on the irradiated layers (3a) of the first photosensitive resin layer (3), and
   wherein a second surface of the first photosensitive resin layer (3) is formed as curved and is extended from the second electrically conductive layer (5) to the first electrically conductive layer (2).

2. The method according to claim 1, wherein step b) is carried out under vacuum.

3. The method according to claim 1 wherein during step b) or step d), the first photosensitive resin layer (3) is heated to between 70° ° C. and 150° C.

4. The method according to claim 1, wherein the stamp has a relief print, at least one part of the relief print being arranged to be pressed directly against the surface of the substrate in step b).

5. The method according to claim 4, wherein said relief print defines said at least a first level of the timepiece component.

6. The method according to claim 1, wherein the second electrically conductive layer (5) is deposited through a stencil mask (4').

7. The method according to claim 1, wherein the second electrically conductive layer (5) is applied in a general deposition over all the exposed surfaces including sidewalls and then entirely removed except from one or more portions of the upper surface of the first photosensitive resin layer.

8. The method according to claim 1, wherein in step d'), the second electrically conductive layer (5) is deposited by printing an ink or a conductive resin.

9. The method according to claim 1, wherein said first electrically conductive layer (2) and said second electrically conductive layer (5) include any of Au, Ti, Pt, Ag, Cr, and Pd.

10. The method according to claim 1, wherein the second electrically conductive layer (5) has a thickness comprised between 50 nm and 500 nm.

11. The method according to claim 1, wherein substrate (1) is made of silicon.

12. The method according to claim 1, wherein the first electrically conductive layer (2) has a thickness comprised between 50 nm and 500 nm.

13. The method according to claim 1,
wherein, in step b) the surface of the second photosensitive resin layer (6) is formed on an outer surface of the first photosensitive resin layer (3) by the hot stamping using the stamp of step b), and
wherein step e) comprises the depositing by electroforming the metallic layer (7) against the least the surface of the first photosensitive resin layer (3), and thereby forming the surface of the timepiece component along the at least one surface and in a manner such that the surface of the timepiece component is formed as curved.

14. The method according to claim 1, wherein the timepiece component comprises at least one of a pallet fork and an escape wheel.

15. A method for the fabrication of at least one timepiece component comprising the following steps:

a') providing a substrate (1), depositing thereon a first electrically conductive layer (2) and applying a first photosensitive resin (3) layer;

b') irradiating the first photosensitive resin layer (3) through a mask (4) defining at least a first level of the timepiece component and dissolving the non-irradiated areas (3b) of the first photosensitive resin layer (3) to reveal, in places, the first electrically conductive layer (2);

c') applying a second photosensitive resin layer (6) covering the structure resulting from step b'), d') hot stamping the second photosensitive resin layer (6) using a stamp to shape the second photosensitive resin layer and define a second level of the timepiece component;

e') irradiating the second shaped photosensitive resin layer (6) through a mask (4") defining a second level of the timepiece component and dissolving the non-irradiated areas (6b) of the second photosensitive resin layer (6) to form a mould comprising a first and a second level;

f) depositing a metallic layer (7) by electroforming in the mould from the first electrically conductive layer (2) to form the timepiece component, the metallic layer (7) substantially reaching the upper surface of the second photosensitive resin layer (6);

g') successively removing the substrate, the first electrically conductive layer, the first photosensitive resin layer (3) and the second photosensitive resin layer (6) to release the timepiece component, wherein in step d') a surface of the second photosensitive resin layer (6) is formed as at least one of beveled and chamfered, and wherein in step f') a surface of the timepiece component is formed as the one of beveled and chamfered against the surface of the second photosensitive resin layer (6), wherein the method includes a step d"), after step c'), which consists in locally depositing a second electrically conductive layer (5) on irradiated layers (3a) of the first photosensitive resin layer (3), and wherein a second surface of the first photosensitive resin layer (3) is formed as curved and is extended from the second electrically conductive layer (5) to the first electrically conductive layer (2).

16. The method according to claim 15, wherein step d') is carried out under vacuum.

17. The method according to claim 15 wherein during step d'), the first photosensitive resin layer (3) is heated to between 70° C. and 150° C.

* * * * *